(12) United States Patent
Ebihara et al.

(10) Patent No.: US 10,297,666 B2
(45) Date of Patent: May 21, 2019

(54) SEMICONDUCTOR DEVICE WITH A WELL REGION

(71) Applicant: Mitsubishi Electric Corporation, Chiyoda-ku (JP)

(72) Inventors: Kohei Ebihara, Tokyo (JP); Hiroshi Watanabe, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/564,389

(22) PCT Filed: Apr. 14, 2015

(86) PCT No.: PCT/JP2015/061425
§ 371 (c)(1),
(2) Date: Oct. 4, 2017

(87) PCT Pub. No.: WO2016/166808
PCT Pub. Date: Oct. 20, 2016

(65) Prior Publication Data
US 2018/0138272 A1 May 17, 2018

(51) Int. Cl.
*H01L 29/16* (2006.01)
*H01L 29/06* (2006.01)
(Continued)

(52) U.S. Cl.
CPC .......... *H01L 29/1608* (2013.01); *H01L 23/24* (2013.01); *H01L 23/3185* (2013.01);
(Continued)

(58) Field of Classification Search
CPC ............. H01L 29/1608; H01L 29/0619; H01L 29/402; H01L 29/66143
See application file for complete search history.

(56) References Cited

U.S. PATENT DOCUMENTS 5,973,359 A 10/1999 Kobayashi et al.
8,450,828 B2 5/2013 Suekawa
(Continued)

FOREIGN PATENT DOCUMENTS

JP 11-145466 A 5/1999
JP 2010-034306 A 2/2010
(Continued)

OTHER PUBLICATIONS

International Preliminary Report on Patentability and Written Opinion dated Oct. 26, 2017 in PCT/JP2015/061425 (with English translation).

(Continued)

*Primary Examiner* — Phat X Cao
(74) *Attorney, Agent, or Firm* — Oblon, McClelland, Maier & Neustadt, L.L.P.

(57) ABSTRACT

Supposing x is defined as a position of an end of a depletion layer extending when a rated voltage V [V] is applied to a rear surface electrode, $W_1$ is defined as a distance between the position x and an outer peripheral edge of a surface electrode in an outer peripheral direction, $W_2$ is defined as a distance between the position x and an outer peripheral edge of a field insulating film in the outer peripheral direction, t [μm] is defined as a film thickness t [μm] of the field insulating film, a layout of a terminal part is defined so that an electrical field in the field insulating film at the position x expressed as $W_2 V / t(W_1 + W_2)$ is 3 MV/cm or smaller.

9 Claims, 6 Drawing Sheets

(51) Int. Cl.
- H01L 29/78 (2006.01)
- H01L 29/872 (2006.01)
- H01L 23/24 (2006.01)
- H01L 29/40 (2006.01)
- H01L 29/861 (2006.01)
- H01L 23/31 (2006.01)
- H01L 29/739 (2006.01)

(52) U.S. Cl.
CPC ........ *H01L 29/0619* (2013.01); *H01L 29/402* (2013.01); *H01L 29/78* (2013.01); *H01L 29/8611* (2013.01); *H01L 29/872* (2013.01); *H01L 23/3171* (2013.01); *H01L 29/7395* (2013.01); *H01L 2924/01014* (2013.01); *H01L 2924/10253* (2013.01); *H05K 2201/0154* (2013.01)

(56) References Cited

U.S. PATENT DOCUMENTS

| | | | |
|---|---|---|---|
| 9,184,307 B2 | 11/2015 | Tarui et al. | |
| 9,240,451 B2 | 1/2016 | Imai | |
| 9,257,511 B2 | 2/2016 | Rupp et al. | |
| 2012/0146055 A1* | 6/2012 | Mitani | H01L 29/0619 257/77 |
| 2014/0291697 A1* | 10/2014 | Rupp | H01L 29/1608 257/77 |
| 2015/0060882 A1* | 3/2015 | Tarui | H01L 29/36 257/77 |

FOREIGN PATENT DOCUMENTS

| | | |
|---|---|---|
| JP | 2013-098316 A | 5/2013 |
| JP | 2013-191716 A | 9/2013 |
| JP | 2013-211503 A | 10/2013 |
| JP | 2013-239607 A | 11/2013 |
| JP | 2014-207444 A | 10/2014 |
| JP | 2015-046500 A | 3/2015 |

OTHER PUBLICATIONS

Japanese Office Action dated May 9, 2017 in Japanese Patent Application No. 2017-512488 (with unedited computer generated English translation).

International Search Report dated Jun. 2, 2015 in PCT/JP2015/061425, filed on Apr. 14, 2015.

* cited by examiner

SEMICONDUCTOR DEVICE WITH A WELL REGION

TECHNICAL FIELD

The present invention relates to a semiconductor device such as a silicon carbide semiconductor device.

BACKGROUND ART

Recently, a semiconductor device using silicon carbide (SiC) (referred to as "the silicon carbide semiconductor device" hereinafter) attracts attention as a next-generation semiconductor device capable of achieving a high withstand voltage and low loss. Since a dielectric breakdown electrical field strength of SiC is approximately 10 times as large as that of silicon (Si) which has been used for a conventional semiconductor device, particularly expected is a development of the silicon carbide semiconductor device to a high withstand voltage power semiconductor device.

It is known that in the silicon carbide semiconductor device, in order to further enhance the withstand voltage, a p-type guard ring region (a terminal well region) is provided in a so-called terminal region (a terminal part) in an n-type silicon carbide semiconductor layer to reduce an electrical field caused by a reverse voltage by a depletion layer which is formed by a PN junction between the silicon carbide semiconductor layer and the guard ring region (for example, Patent Document 1). Moreover, in a Schottky barrier diode made of SiC (SiC-SBD, SiC-Schottky Barrier Diode) described in Patent Document 1, an interlayer dielectric film (a field insulating film) is provided on the silicon carbide semiconductor layer in the terminal region, and an outer peripheral edge of a surface electrode is formed to extend onto the interlayer dielectric film. Furthermore, polyimide is formed as a protective film to cover part of the surface electrode and the interlayer dielectric film.

PRIOR ART DOCUMENT

Patent Document

Patent Document 1: Japanese Patent Application Laid-Open No. 2013-211503

SUMMARY

Problem to be Solved by the Invention

The semiconductor device with the protective film such as a polyimide may be sealed with a resin. In a case where this resin is a gel, when the semiconductor device is particularly used in a high humidity state, the gel or polyimide may contain moisture, thereby causing a leak path from an outer peripheral part of a semiconductor chip to an end portion of the surface electrode on the interlayer dielectric film (field insulating film). In such a case, a large potential difference occurs between a lower part of the interlayer dielectric film (the field insulating film), particularly an area around an outer periphery of the guard ring region, and an upper part of the interlayer dielectric film (the field insulating film); an insulation breakdown occurs in the interlayer dielectric film (the field insulating film), thereby causing a defect of the semiconductor chip, in some cases.

The present invention has been achieved to solve problems as described above, and it is an object of the present invention to provide a semiconductor device in which a defect does not occur in a semiconductor chip sealed with a gel even when the semiconductor chip is used in a high humidity state.

Means to Solve the Problem

A semiconductor device according to the present invention includes: a semiconductor substrate; a semiconductor layer of a first conductivity type being formed on the semiconductor substrate; a field insulating film being formed on a surface of the semiconductor layer; a surface electrode being fainted on the surface of the semiconductor layer within an inner periphery of the field insulating film and extending onto the field insulating film; a well region of a second conductivity type being formed at a surface-layer part of the semiconductor layer in contact with the surface electrode and extending outward beyond an outer peripheral edge of the surface electrode; a surface protective film being made of an insulating material and formed on the surface electrode and the field insulating film to cover an outer peripheral edge of the surface electrode and an outer peripheral edge of the field insulating film; a sealing gel being formed on an outer peripheral part of the semiconductor layer on the semiconductor layer and the surface protective film; and a rear surface electrode formed on a rear surface of the semiconductor substrate, wherein x is defined as a position of an end of a depletion layer extending from the well region toward an outer peripheral direction of the semiconductor layer when a rated voltage V [V] is applied to the rear surface electrode, $W_1$ is defined as a distance between the position x and the outer peripheral edge of the surface electrode in the outer peripheral direction, $W_2$ is defined as a distance between the position x and the outer peripheral edge of the field insulating film in the outer peripheral direction, and a film thickness t [μm] of the field insulating film satisfies $t \geq W_2 V/300(W_1+W_2)$.

Effects of the Invention

According to the semiconductor device of the present invention, even when the sealing gel and the surface protective film contain moisture and a leak path therefore occurs in the surface of the field insulating film, the electrical field applied to the insulating film such as the field insulating film can be suppressed to a predetermined level or lower, thus the breakdown of the element in the semiconductor device can be suppressed.

DESCRIPTION OF EMBODIMENT(S)

Embodiments are described hereinafter with reference to attached drawings. Since the drawings are schematically illustrated, a mutual relationship of sizes and positions of images respectively illustrated in the different drawings is not necessarily illustrated accurately, but may be appropriately changed. In the description hereinafter, the same reference signs will be assigned to a similar constituent element and a name and function are also similar. Thus, the detailed description of them may be omitted in some cases. Moreover, the term of "on ~" or "cover ~" in the present description does not interfere a presence of an inclusion between the constituent elements. For example, the description of "B provided on A" and "A covers B" includes both states where another constituent element C is provided between A and B and C is not provided between A and B.

Embodiment 1

Firstly, a configuration of a terminal part of a semiconductor device 100 according to embodiment 1 of the present invention is described. A SiC-SBD having a first conductivity type of n-type and a second conductivity type of p-type is exemplified and described hereinafter, however, a semiconductor device having a first conductivity type of p-type and a second conductivity type of n-type is also applicable, and a PN junction diode or a JBS (Junction Barrier Schottky) diode is also applicable instead of the SBD.

Figure 1:
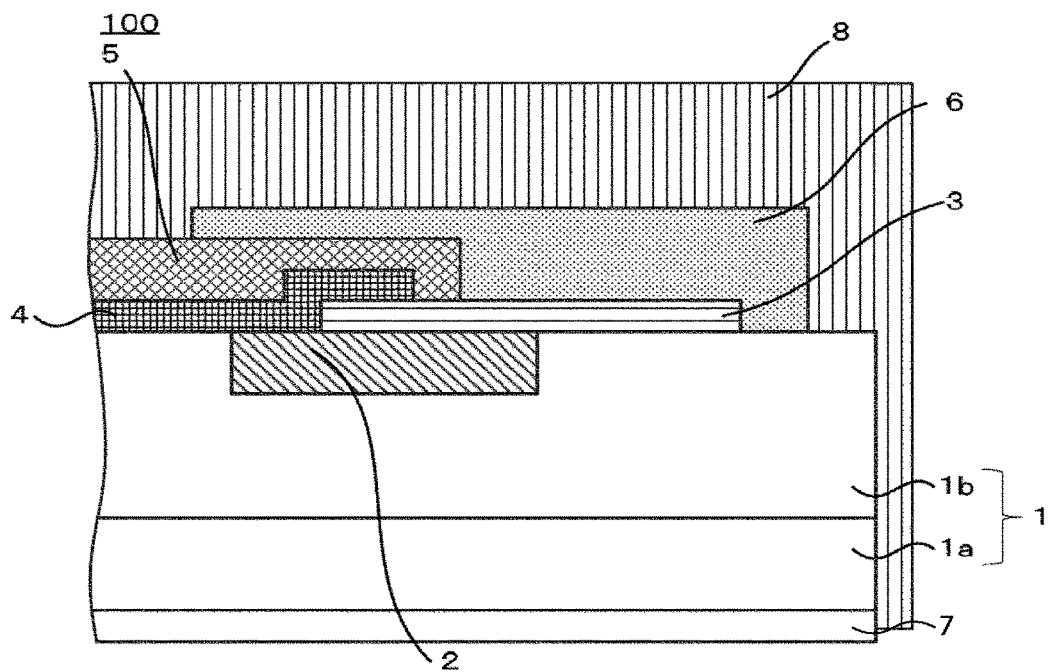
FIG. 1 A cross sectional view schematically illustrating a terminal part of a semiconductor device according to embodiment 1 of the present invention.

FIG. 1 is a cross sectional view schematically illustrating a configuration of the terminal part of the semiconductor device 100 according to embodiment 1. As illustrated in FIG. 1, the semiconductor device 100 includes a semiconductor substrate 1a, a semiconductor layer 1b formed on the semiconductor substrate 1a, a field insulating film 3 formed on the semiconductor layer 1b other than a central part, a Schottky electrode 4 as a first surface electrode formed to extend onto the field insulating film 3 from the central part where the field insulating film 3 is not located, an electrode pad 5 as a second surface electrode formed on the Schottky electrode 4, a terminal well region 2 formed at a surface-layer part of the semiconductor layer 1b to extend toward an outer periphery beyond an outer peripheral edge of the electrode pad 5, a surface protective film 6 formed on the electrode pad 5 and the field insulating film 3 to cover the outer peripheral edge of the electrode pad 5 and an outer peripheral edge of the field insulating film 3, a sealing gel 8 formed on an outer peripheral part of the semiconductor layer 1b so as not to expose surfaces of the semiconductor layer 1b and surface protective film 6, and a rear surface electrode 7 formed on a rear surface of the semiconductor substrate 1a. The terminal well region 2 is formed to have a ring shape, extending outward beyond the outer peripheral edge of the electrode pad 5 from an inner side of an outer peripheral edge of the Schottky electrode 4.

In FIG. 1, a terminal part of the semiconductor device 100 is located on a right side; an active region, in which a principal current flows in an on-state, is located on a left side.

The semiconductor substrate 1a and the semiconductor layer 1b are made up of a silicon carbide semiconductor of 4H type, and the semiconductor substrate 1a is a low resistance n-type substrate, and the semiconductor layer 1b has an n-type of an impurity concentration $1 \times 10^{14}$ cm$^{-3}$ to $1 \times 10^{17}$ cm$^{-3}$. An inorganic insulating film such as silicon oxide (SiO$_2$) and silicon nitride (SiN) can be used as the field insulating film 3, and silicon oxide having a thickness t [μm] is used in the present embodiment.

The Schottky electrode 4 as the first surface electrode may be a metal which forms a Schottky junction with an n-type silicon carbide semiconductor: titanium, molybdenum, nickel, gold, or tungsten, for example, can be used as a material, whose thickness can be 30 nm to 300 nm, for example. In the present embodiment, a titanium film having a thickness of 200 nm is used as the Schottky electrode 4.

Furthermore, a metal containing one of aluminum, copper, molybdenum and nickel, or an aluminum alloy such as Al—Si, for example, can be used as the electrode pad 5 as the second surface electrode, and its thickness can be 300 nm to 10 μm. In the present embodiment, an Al layer having a thickness of 5 μm is used as the electrode pad 5.

The surface protective film 6 is made of an insulating material and has an opening on a central part of the electrode pad 5 for a connection to an external terminal. The surface protective film 6 is preferably a resin film to reduce a stress from an external environment, and polyimide is used as the surface protective film 6 in the present embodiment.

The rear surface electrode 7 is ohmic-connected to the semiconductor substrate 1a. Thus, a metal such as nickel, aluminum, or molybdenum, which can be ohmic-connected to the n-type silicon carbide semiconductor of the semiconductor substrate 1a, can be used for the rear surface electrode 7. Nickel is used in the present embodiment.

A gel such as a silicone gel is used for the sealing gel 8. A wire (not shown) made of a material such as aluminum is joined to a part of the electrode pad 5, and is connected to an external terminal through an inside of the sealing gel 8.

Herein, when x is defined as a position of an end of a depletion layer extending from the terminal well region 2 toward an outer peripheral direction of the semiconductor layer 1b when a rated voltage V [V] is applied to the rear surface electrode 7, $W_1$ is defined as a distance between the x and an outer peripheral edge of the surface electrode (herein, the electrode pad 5 as the second surface electrode) in the outer peripheral direction, and $W_2$ is defined as a distance between the x and the outer peripheral edge of the field insulating film 3 in the outer peripheral direction, the thickness t [μm] of the field insulating film 3 satisfies $$t \geq W_1 V/300(W_1+W_2) \qquad (1)$$

Next, a method of manufacturing the semiconductor device 100 according to embodiment 1 of the present invention is described.

Firstly, the semiconductor layer 1b which is a silicon carbide of n-type having an impurity concentration of $1\times10^{14}/cm^3$ to $1\times10^{17}/cm^3$ is grown as a an epitaxial crystal on the semiconductor substrate 1a which is a low-resistance silicon carbide semiconductor of $n^+$ type having an off-angle. Next, a resist film is patterned to have a predetermined shape by a photolithography process, for example, and a p-type impurity such as Al or B is subsequently ion-implanted over the resist film, and annealing is performed at a high temperature of 1500° C. or higher to form the p-type terminal well region 2 (the guard ring region) at the surface-layer part in the semiconductor layer 1b.

A dose amount (an impurity concentration) of the terminal well region 2 is preferably $1\times10^{13}/cm^2$ to $1\times10^{14}/cm^2$, and more preferably $2\times10^{13}/cm^2$ to $5\times10^{13}/cm^2$. $2.0\times10^{13}/cm^2$ is applied in the present embodiment. When Al is implanted as the ion implantation of a p-type impurity, an implantation energy is 100 keV to 700 keV, for example. In the above case, when the dose amount [$cm^{-2}$] of the p-type impurity in each region described above is converted into the impurity concentration [$cm^{-3}$], the impurity concentration of the terminal well region 2 is $1\times10^{17}/cm^3$ to $1\times10^{19}/cm^3$.

Next, a silicon oxide film having the thickness t [μm] is deposited on the surface of the semiconductor layer 1b by a CVD method, for example, and then, the silicon oxide film located on the central part of the semiconductor layer 1b is removed by a photolithography process and an etching to form the field insulating film 3 having the opening part. An opening end of the field insulating film 3 is formed to be located on the terminal well region 2. Subsequently, the rear surface electrode 7 is formed on the rear surface of the silicon carbide substrate 1a by a sputtering method, for example.

Next, on the entire surface of the semiconductor layer 1b on which the field insulating film 3 is formed, a metal film which is to be the Schottky electrode 4 is laminated by a sputtering method, for example, and the Schottky electrode 4 having a desired shape is formed by a photolithography process and an etching. Although a dry etching or a wet etching can be used for etching the metal film, the wet etching is preferable to reduce an influence on characteristics of the semiconductor device, and a hydrofluoric acid (HF) is used as an etching solution, for example.

Subsequently, the electrode pad 5 is formed on the field insulating film 3 and the Schottky electrode 4 to cover the Schottky electrode 4. The electrode pad 5 is formed by a photolithography process and an etching in a manner similar to the Schottky electrode 4. The etching of the metal film is performed by a wet etching using an etching solution of phosphoric acid, for example.

Next, the surface protective film 6 is formed to cover the electrode pad 5. A photosensitive polyimide is applied and exposed to provide the surface protective film 6 with a desired shape. Then, the wire is formed on the electrode pad 5, and subsequently sealed with the sealing gel 8, thereby the semiconductor device 100 according to the present embodiment illustrated in FIG. 1 is completed.

The rear surface electrode 7 may be formed after the process performed on a surface side of the semiconductor substrate 1 is entirely completed. The sealing using the sealing gel 8 may be performed after connecting the rear surface electrode 7 to another conductor.

Figure 2:
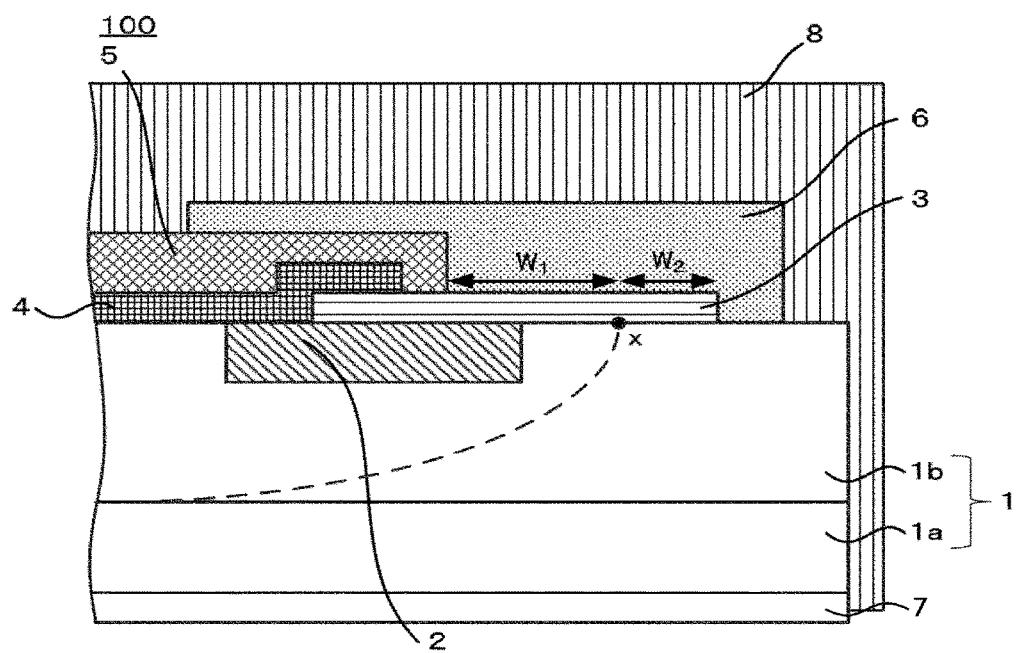
FIG. 2 A cross sectional view schematically illustrating a spread of a depletion layer in an off-state in the terminal part of the semiconductor device according to embodiment 1 of the present invention.

Next, an operation of the SiC-SBD which is the semiconductor device 100 according to the present embodiment is described using FIG. 2.

In the SiC-SBD according to the present embodiment, when a negative voltage is applied to the rear surface electrode 7 with respect to the surface electrode (the first surface electrode and the second surface electrode), a current flows from the surface electrode to the rear surface electrode 7, and the semiconductor device 100 enters a conduction state (on-state). In contrast, when a positive voltage is applied to the rear surface electrode 7 with respect to the surface electrode, the semiconductor device 100 enters a blocking state (off-state).

When the semiconductor device 100 enters the off-state, a large electrical field is applied to the surface of the active region of the semiconductor layer 1b and an area around a PN junction interface between the semiconductor layer 1b and the terminal well region 2, and when a voltage exceeding a critical electrical field is applied to the rear surface electrode 7, an avalanche breakdown occurs. Normally, the semiconductor device 100 is used within a range in which the avalanche breakdown does not occur; the rated voltage V [V] is determined.

When the semiconductor device 100 enters the off-state, the depletion layer expands from the terminal well region 2 toward the outer peripheral direction of the semiconductor layer 1b and the direction of the semiconductor substrate 1a as illustrated in FIG. 2. Herein, a position indicated by a dotted line indicates a position of the end of the depletion layer.

When the positive voltage V [V] which is the rated voltage is applied to the rear surface electrode 7 with respect to the surface electrode, the depletion layer extends to a position x of the surface of the semiconductor layer 1b on the surface of the semiconductor layer 1b toward the outer peripheral direction as illustrated in FIG. 2. At this time, W1 is defined as a distance between the position x and the outer peripheral edge of the electrode pad 5 in the outer peripheral direction, and W2 is defined as a distance between the position x and the outer peripheral edge of the field insulating film 3 in the outer peripheral direction.

It is considered that when the SiC-SBD according to the present embodiment is used in a high humidity state, for example, the sealing gel 8 may contain moisture, and the moisture may penetrate the surface protective layer 6 such as polyimide. At that time, a leak path of the current on the surface of the field insulating film 3 occurs from the outer peripheral part of the semiconductor device 100 (a right side in FIG. 2) to the surface electrode (the electrode pad 5, for example). When such a leak path occurs, under an assumption that a resistance of the leak path is constant, a potential [V] of the surface of the field insulating film 3 right above the position x when the rated voltage V [V] is applied to the rear surface electrode 7 is expressed as:

$$W_1 V/(W_1+W_2) \tag{2}$$

A potential of the position x at this time is the same as the rated voltage V [V]. Accordingly, a potential difference [V] which occurs between the position x and the surface of the field insulating film 3 right above the position x is expressed as:

$$W_2 V/(W_1+W_2) \tag{3}$$

Since the thickness of the field insulating film 3 is t [μm] the electrical field in the field insulating film 3 at the position x is expressed as:

$$W_2 V/t(W_1+W_2) \tag{4}$$

The field insulating film 3 mainly contains the silicon oxide or the silicon nitride, and a dielectric breakdown electrical field of the insulating film of such materials is approximately 5 to 10 MV/cm; however, with a high voltage near 5 MV/cm, insulation characteristics of the field insulating film 3 may be reduced due to injection of an electron or positive hole accelerated by the electrical field, and an element breakdown may occur in the semiconductor device 100 in some cases. Moreover, there is an example of a report that also with approximately 3 MV/cm, the oxide film deteriorates in a few decades and is therefore broken.

Accordingly, in the semiconductor device 100 according to the present invention, the electrical field applied to the field insulating film 3 is set to 3 MV/cm or smaller. The following inequality needs to be satisfied to suppress the electrical field applied to the field insulating film 3 to 3 MV/cm or smaller.

$$t \geq W_2 V / 300 (W_1 + W_2) \tag{5}$$

As described above, according to the semiconductor device according to embodiment 1 of the present invention, even when the sealing gel 8 and the surface protective film 6 contain moisture and the leak path therefore occurs on the surface of the field insulating film 3, the electrical field applied to the field insulating film 3 can be suppressed to 3 MV/cm or smaller, thus the breakdown of the element in the semiconductor device can be suppressed, and a reliability of the semiconductor device can be enhanced.

Although the semiconductor device 100 is described as the SiC-SBD in the present embodiment, the similar effect can be achieved also when the semiconductor device 100 is a SiC—PN diode.

Figure 3:
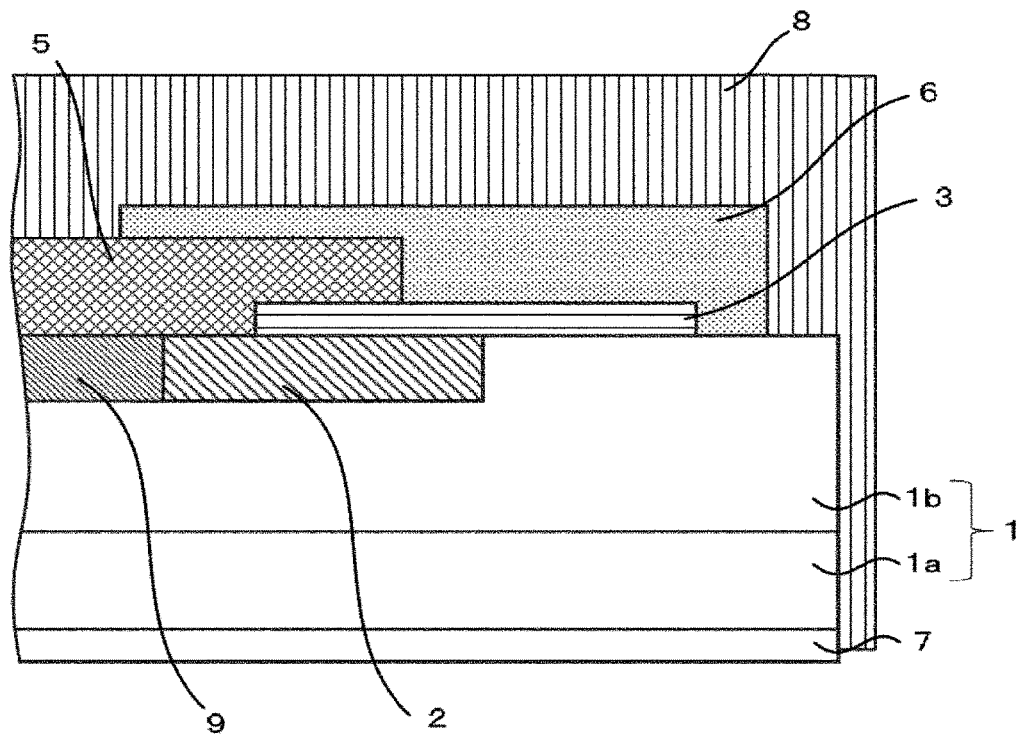
FIG. 3 A cross sectional view schematically illustrating the terminal part of the semiconductor device according to embodiment 1 of the present invention.

FIG. 3 is a schematic cross sectional view illustrating a case where the semiconductor device 100 is the SiC—PN diode. In FIG. 3, an active well region 9 of a second conductivity type is formed at the surface-layer part of the semiconductor layer 1 inside the terminal well region 2, and the Schottky electrode 4 as the first surface electrode is not provided. Herein, the active well region 9 is made of the silicon carbide semiconductor, and the electrode pad 5 as the second surface electrode is ohmic-connected to the active well region 9.

According to the semiconductor device of the present invention, the SiC—PN diode as illustrated in FIG. 3 can achieve the effect similar to the SiC-SBD.

Although not shown in the drawings, a barrier metal made of Ti, for example, may be provided between the electrode pad 5 and the field insulating film 3. The barrier metal may be a metal thin film containing Ti, such as Ti, TiN, or TiSi, for example, and may have a structure of laminating a plurality of layers made of these metals.

Furthermore, in the above description of the present embodiment, an end portion of the Schottky electrode 4 as the first surface electrode is covered with the electrode pad 5 as the second surface electrode, and the outer peripheral edge of the surface electrode is the end portion of the electrode pad 5 as the second surface electrode; however, the end portion of the first surface electrode needs not be covered with the end portion of the second surface electrode.

Figure 4:
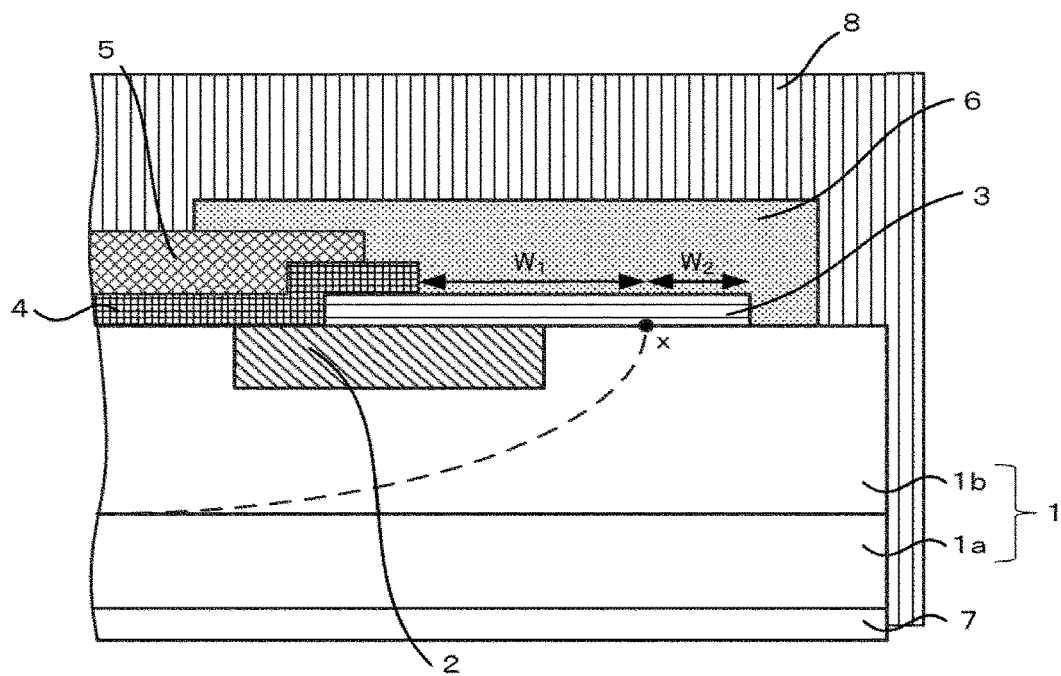
FIG. 4 A cross sectional view schematically illustrating a spread of the depletion layer in the off-state in the terminal part of the semiconductor device according to embodiment 1 of the present invention.

FIG. 4 is a schematic cross sectional view of the SiC-SBD where the end portion of the Schottky electrode 4 of the semiconductor device 100 is not covered with the end portion of the electrode pad 5. In FIG. 4, the end portion of the Schottky electrode 4 protrudes from the end portion of the electrode pad 5, so that the outer peripheral edge of the surface electrode is the end portion of the Schottky electrode 4. Even such a semiconductor device 100 achieves the effect similar to the above description by forming the field insulating film 3 having a thickness to satisfy an inequality (5).

In the present embodiment, the semiconductor device made up of the silicon carbide semiconductor is described as the example, however, the material of the semiconductor may be another material such as GaN or diamond, or another wide band gap semiconductor device is also applicable. Since the semiconductor device of the wide band gap semiconductor is mostly used at a high voltage of 2000V or higher or 3000V or higher, the electrical field applied to the field insulating film increases. Accordingly, in the semiconductor device in which the wide band gap semiconductor such as SiC is used, the significant effect can be achieved by defining the layout of the terminal part and the thickness of the field insulating film.

Embodiment 2

In embodiment 1, the example of the semiconductor device of the SiC-SBD or the SiC—PN diode is described; in the present embodiment, an example of the semiconductor device in which the present invention is applied to a switching element is described. Described hereinafter is a case where a semiconductor device 200 is an n-type SiC-MOSFET (Metal Oxide Semiconductor Field Effect Transistor) having a first conductivity type of n-type and a second conductivity type of p-type; however, a semiconductor device having a first conductivity type of p-type and a second conductivity type of n-type is also applicable, or a switching element such as an IGBT (Insulated Gate Bipolar Transistor) or a JFET (Junction Field Effect Transistor) is also applicable instead of the MOSFET.

Figure 5:
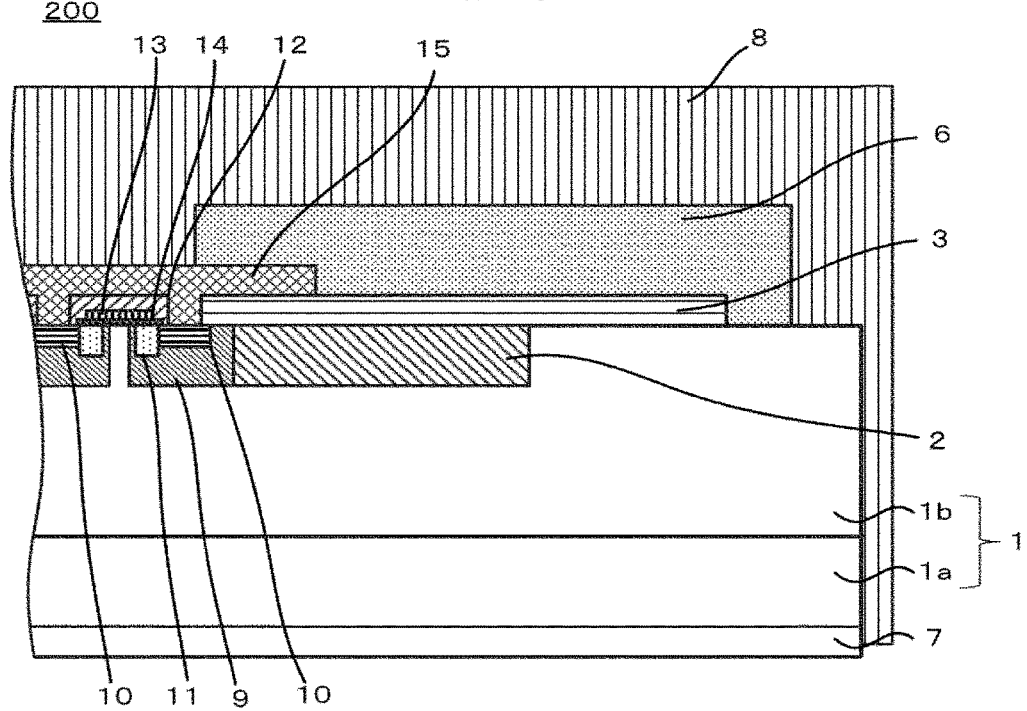
FIG. 5 A cross sectional view schematically illustrating the terminal part of the semiconductor device according to an embodiment 2 of the present invention.

FIG. 5 is a cross sectional view schematically illustrating a configuration of a terminal part of the semiconductor device 200 according to the present embodiment of the present invention. As illustrated in FIG. 5, the semiconductor device 200 includes the semiconductor substrate 1a, the semiconductor layer 1b forming on the semiconductor substrate 1a, the field insulating film 3 formed on the semiconductor layer 1b other than a central part, a source electrode 15 as a third surface electrode formed to extend onto the field insulating film 3 from the central part where the field insulating film 3 is not located, the terminal well region 2 formed at the surface-layer part of the semiconductor layer 1b to extend toward the outer periphery beyond the outer peripheral edge of the source electrode 15, the surface protective film 6 formed on the source electrode 15 and the field insulating film 3 to cover the outer peripheral edge of the source electrode 15 and the outer peripheral edge of the field insulating film 3 the sealing gel 8 formed on the outer peripheral part of the semiconductor layer 1b so as not to expose the surfaces of the semiconductor layer 1b and surface protective film 6, and a drain electrode which is the rear surface electrode 7 formed on the rear surface of the semiconductor substrate 1a.

The source electrode 15 is connected to the active well region 9 of the second conductivity type provided at the surface-layer part of the semiconductor layer 1b, and the active well region 9 located on the outermost periphery is connected to the terminal well region 2 at the surface-layer part of the semiconductor layer 1b. The plurality of active well regions 9 are formed, and a source region 11 of a first conductivity type is formed inward the outer periphery of each active well region 9 by a predetermined distance at the surface-layer part of the active well region 9. A high concentration active well region 10 of the second conductivity type having an impurity concentration of the second conductivity type higher than that of the active well region 9 is formed in a position inward the outer periphery of each active well region 9 by a predetermined distance to be connected to the source electrode 15.

A gate insulating film 14 is formed on the layers of the semiconductor material, including the active well region 9 on which the field insulating film 3 is not formed, the semiconductor layer 1b, the source region 11, and the high concentration active well region 10, for example; a gate electrode 13 is forming on upper portions of the active well region 9 and the semiconductor layer 1b with the gate insulating film 14 therebetween. An interlayer dielectric film 12 is formed on upper portions of the gate insulating film 14 and the gate electrode 13, and a contact hole which connects the high concentration active well region 10 and the source electrode 15 is formed in the interlayer dielectric film 12 and the gate insulating film 14. The source electrode 15 extends on the interlayer dielectric film 12.

In FIG. 5, a terminal part of the semiconductor device 200 is located on a right side; an active region, in which a principal current flows in an on-state, is located on a left side.

The semiconductor substrate 1a and the semiconductor layer 1b are made of a silicon carbide semiconductor of 4H type, and the semiconductor substrate 1a is a low resistance n-type substrate, and the semiconductor layer 1b has an n-type of an impurity concentration $1\times10^{14}$ cm$^{-3}$ to $1\times10^{17}$ cm$^{-3}$. The gate insulating film 14 and the interlayer dielectric film 12 is made of silicon oxide, and the gate electrode 13 is made of a low resistance polysilicon. The source electrode 15 may be made of a metal such as Al.

Although not shown in the drawings, a barrier metal made of Ti, for example, may be provided between the source electrode 15 and the interlayer dielectric film 12 and between the source electrode 15 and the field insulating film 3. The barrier metal may be a metal thin film containing Ti, such as Ti, TiN, or TiSi, for example, and have a structure of laminating a plurality of layers made of these metals.

When x is defined as a position of an end of a depletion layer extending from the terminal well region 2 on the surface of the semiconductor layer 1b, or an interface between the field insulating film 3 and the semiconductor layer 1b, toward the outer peripheral direction of the semiconductor layer 1b when a rated voltage V [V] is applied to the rear surface electrode 7 with respect to the surface electrode (the source electrode 15), $W_1$ is defined as the distance between the x and the outer peripheral edge of the surface electrode (herein, the source electrode 15 as the third surface electrode) in the outer peripheral direction, and $W_2$ is defined as a distance between the x and the outer peripheral edge of the field insulating film 3 in the outer peripheral direction, the thickness t [μm] of the field insulating film 3 satisfies $$t \geq W_1 V/300(W_1+W_2) \quad (1)$$

Next, a method of manufacturing the semiconductor device 200 according to the present embodiment is described.

Firstly, the semiconductor layer 1b which is the silicon carbide of n-type having the impurity concentration of $1\times10^{14}$/cm$^3$ to $1\times10^{17}$/cm$^3$ is grown in the form of the epitaxial crystal on the semiconductor substrate 1a which is the low-resistance silicon carbide semiconductor of n$^+$ type having the off-angle. Next, the resist film is patterned to have the predetermined shape by the photolithography process, for example, and the p-type impurity such as Al or B is subsequently ion-implanted over the resist film, and annealing is performed at the high temperature of 1500° C. or higher to form the p-type terminal well region 2 (the guard ring region) at the surface-layer part in the semiconductor layer 1b.

The dose amount (the impurity concentration) of the terminal well region 2 is preferably $1\times10^{13}$/cm$^2$ to $1\times10^{14}$/cm$^2$, and more preferably $2\times10^{13}$/cm$^2$ to $5\times10^{13}$/cm$^2$. $2.0\times10^{13}$/cm$^2$ is applied in the present embodiment. When Al is implanted as the ion implantation of the p-type impurity, the implantation energy is 100 keV to 700 keV, for example. In the above case, when the dose amount [cm$^2$] of the p-type impurity in each region described above is converted into the impurity concentration [cm$^{-3}$], the impurity concentration of the terminal well region 2 is $1\times10^{17}$/cm$^3$ to $1\times10^{19}$/cm$^3$.

The active well region 9, the source region 11, and the high concentration active well region 10 are also formed by, in a manner similar to the terminal well region 2, patterning a resist film to have a predetermined shape by a photolithography process, for example, and subsequently ion-implanting a p-type impurity such as Al or B or an n-type impurity such as N of P over the resist film. An activation anneal after the ion implantation may be performed simultaneously with the formation of terminal well region 2.

Next, a silicon oxide film having the thickness t is deposited on the surface of the semiconductor layer 1b by a CVD method, for example, and then, the silicon oxide film located on the central part of the semiconductor layer 1b is removed by a photolithography process and an etching to form the field insulating film 3 having the opening part. An opening end of the field insulating film 3 is formed to be located on the active well region 9. Subsequently, the rear surface electrode 7 is formed on the rear surface of the silicon carbide substrate 1a.

Next, a silicon oxide film which is to be the gate insulating film 14 is deposited on the active region, on which the field insulating film 3 is not forming, by a CVD method, for example. Subsequently, a low-resistance polysilicon film which is to be the gate electrode 13 is deposited and patterned, and then, a silicon oxide film which is to be the interlayer dielectric film 12 is deposited on upper portions of the gate insulating film 14 and the gate electrode 13. An opening is formed in a predetermined position of the interlayer dielectric film 12 and the gate insulating film 14, and a metal layer is deposited on the interlayer dielectric film 12 and the field insulating film 3 by the sputtering method, for example, and patterned, thereby forming the source electrode 15.

Subsequently, the surface protective film 6 is formed to cover the source electrode 15 and the field insulating film 3. A photosensitive polyimide is applied and exposed to provide the surface protective film 6 with a desired shape. Then, the wire (not shown) is formed on the source electrode 15, and subsequently sealed with the sealing gel 8, thereby the semiconductor device 200 according to the present embodiment illustrated in FIG. 5 is completed.

The rear surface electrode 7 may be formed after the process performed on the surface side of the semiconductor substrate 1 is entirely completed. The sealing using the sealing gel 8 may be performed after connecting the rear surface electrode 7 to another conductor.

Figure 6:
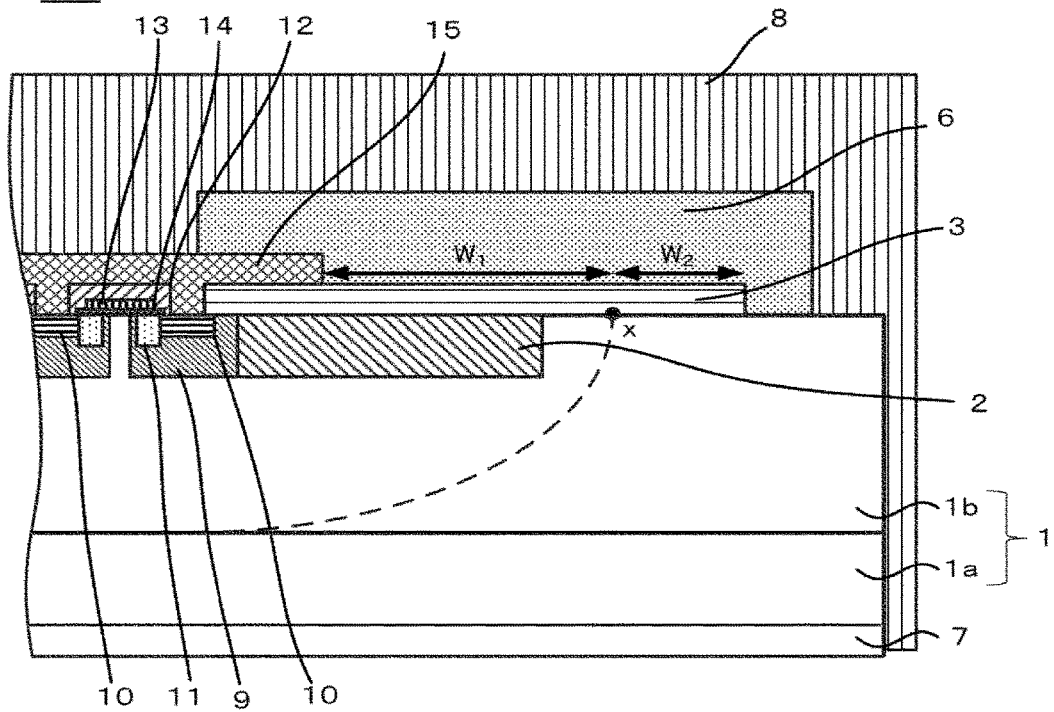
FIG. 6 A cross sectional view schematically illustrating a spread of the depletion layer in the off-state in the terminal part of the semiconductor device according to embodiment 2 of the present invention.

Next, an operation of the SiC-MOSFET which is the semiconductor device 200 according to the present embodiment is described using FIG. 6.

In the SiC-SBD according to the present embodiment, when a predetermined positive voltage higher than a threshold voltage is applied to the gate electrode 13 with respect to the surface electrode (the third surface electrode), a current flows from the rear surface electrode 7 to the surface electrode, and the semiconductor device 200 enters a conduction state (on-state). In contrast, when a predetermined voltage smaller than the threshold voltage is applied to the gate electrode 13 with respect to the surface electrode (the third surface electrode), the semiconductor device 200 enters a blocking state (off-state).

When the positive high voltage is applied to the rear surface electrode 7 with respect to the surface electrode (the third surface electrode) in the state where the semiconductor device 200 enters the off-state, the depletion layer expands from the terminal well region 2 toward the outer peripheral direction of the semiconductor layer 1b and the direction of the semiconductor substrate 1a as illustrated in FIG. 6. Herein, a position indicated by a dotted line indicates a position of the end of the depletion layer.

When the positive voltage V [V] which is the rated voltage is applied to the rear surface electrode 7 with respect to the surface electrode, the depletion layer extends to a position x of the surface of the semiconductor layer 1b on the surface of the semiconductor layer 1b toward the outer peripheral direction as illustrated in FIG. 6. At this time, W1 is defined as a distance between the position x and the outer peripheral edge of the source electrode 15 in the outer peripheral direction, and W2 is defined as a distance between the position x and the outer peripheral edge of the field insulating film 3 in the outer peripheral direction.

When the SiC-MOSFET according to the present embodiment is used in a high humidity state, for example, the sealing gel 8 contains moisture, and the moisture penetrates the surface protective layer 6 such as polyimide. Then, a leak path of the current on the surface of the field insulating film 3 occurs from the outer peripheral part of the semiconductor device 200 (a right side in FIG. 6) to the surface electrode (the source electrode 15, for example). When such a leak path occurs, under an assumption that a resistance of the leak path is constant, a potential [V] of the surface of the field insulating film 3 right above the position x when the rated voltage V [V] is applied to the rear surface electrode 7 is expressed as:

$$W_1 V/(W_1+W_2) \quad (2)$$

The above inequality (1) needs to be satisfied to suppress the electrical field applied to the field insulating film 3 having the thickness t to 3 MV/cm or smaller. The reason of this is already described in embodiment 1; the detailed description is omitted.

Also according to the present embodiment, even when the sealing gel 8 and the surface protective film 6 contain moisture and the leak path therefore occurs on the surface of the field insulating film 3, the electrical field applied to the field insulating film 3 can be suppressed to 3 MV/cm or smaller, thus the breakdown of the element in the semiconductor device can be suppressed, and the reliability of the semiconductor device can be enhanced.

A configuration different from that of embodiment 1 is described in the present embodiment, and the detailed description of the configuration similar to that of embodiment 1 is omitted.

Embodiment 3

Embodiment 2 describes the example of the switching element in which the source electrode 15 extends to the outermost periphery side; however, the gate pad connected to the gate electrode 13 may extend to the outermost periphery side. The present embodiment describes a case where the switching element is the SiC-MOSFET as the example of the switching element in which the gate pad extends to the outermost periphery side.

Figure 7:
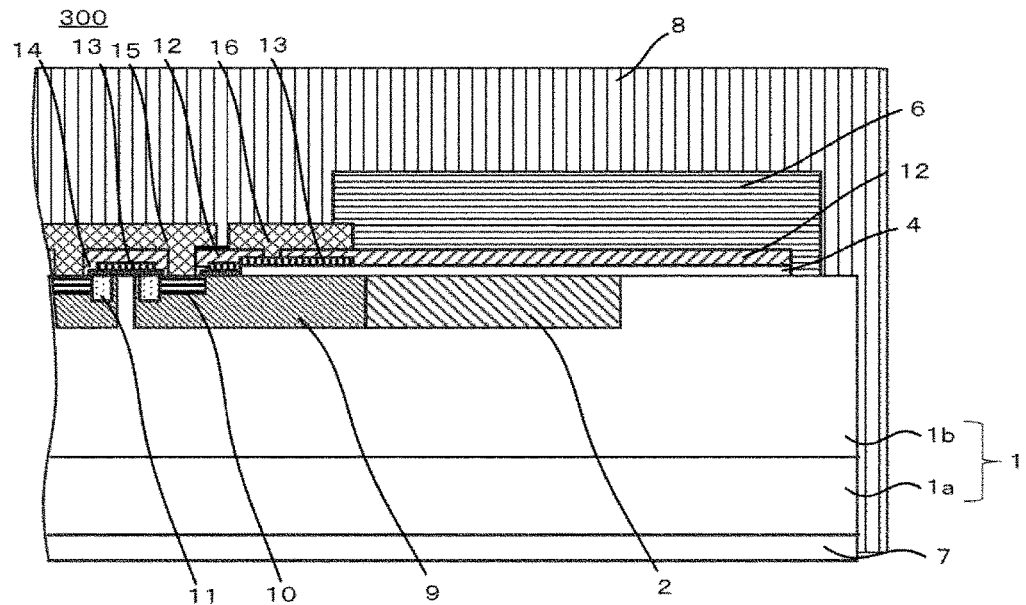
FIG. 7 A cross sectional view schematically illustrating the terminal part of the semiconductor device according to an embodiment 3 of the present invention.

FIG. 7 is a cross sectional view schematically illustrating a configuration of a terminal part of a semiconductor device 300 according to the present embodiment of the present invention. As illustrated in FIG. 7, in the semiconductor device 300, a gate pad 16 is formed on the interlayer dielectric film 12 located on an upper portion of the gate electrode 13 via an opening of the interlayer dielectric film 12 located on the upper portion of the gate electrode 13 extending to a surrounding area of the active region. Herein, a total film thickness of the field insulating film 3 and the interlayer dielectric film 12 is t' [μm]. Another configuration is similar to that of embodiment 2, thus the detailed description is omitted.

In FIG. 7, a terminal part of the semiconductor device 300 is located on a right side, and an active region in which a principal current flows in an on-state is located on a left side.

Figure 8:
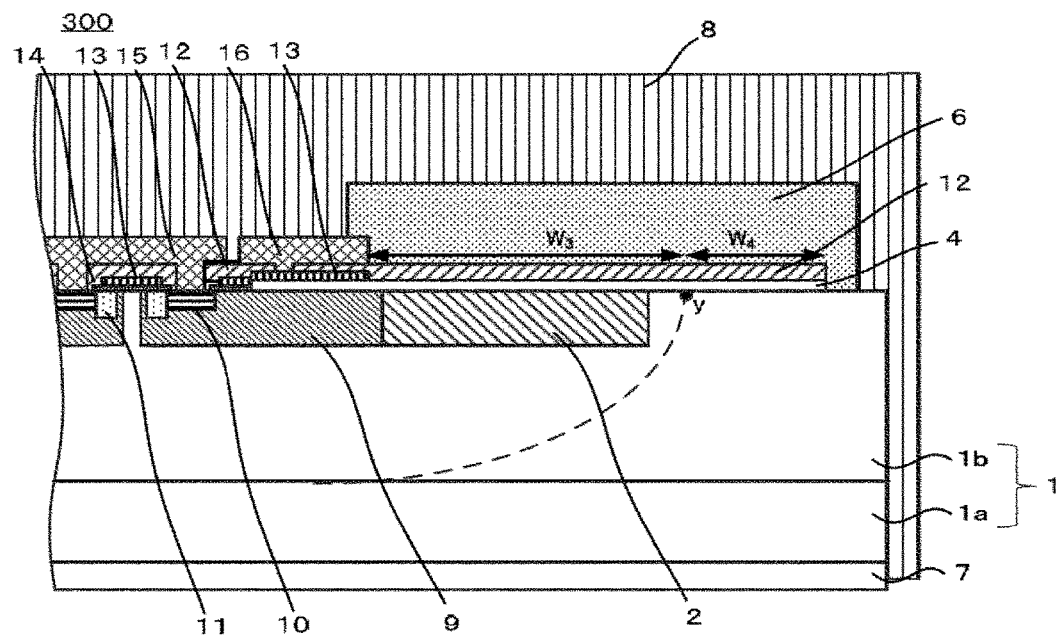
FIG. 8 A cross sectional view schematically illustrating a spread of the depletion layer in the off-state in the terminal part of the semiconductor device according to embodiment 3 of the present invention.

Next, an operation of the SiC-MOSFET which is the semiconductor device 300 according to the present embodiment is described using FIG. 8.

In the SiC-MOSFET according to the present embodiment, when a predetermined positive voltage higher than a threshold voltage is applied to the gate pad 16 (control electrode) with respect to the source electrode 15 (the third surface electrode), a current flows from the rear surface electrode 7 to the source electrode 15, and the semiconductor device 300 enters a conduction state (on-state). In contrast, when a predetermined voltage $V_{goff}$ smaller than the threshold voltage is applied to the gate pad 16 (control electrode) with respect to the source electrode 15 (the third surface electrode), the semiconductor device 300 enters a blocking state (off-state).

When the voltage $V_{goff}$, which turns the semiconductor device off, is applied to the control electrode, and the positive voltage V [V] which is the rated voltage is applied to the rear surface electrode 7 with respect to the surface electrode, the depletion layer extends to a position y of the surface of the semiconductor layer 1b on the surface of the semiconductor layer 1b toward the outer peripheral direction as illustrated in FIG. 8. A position indicated by a dotted line indicates a position of the end of the depletion layer. At this time, $W_3$ is defined as a distance between the position y and the outer peripheral edge of the gate pad 16 in the outer peripheral direction, and $W_4$ is defined as a distance between the position y and the outer peripheral edge of the field insulating film 3 in the outer peripheral direction.

When the SiC-MOSFET according to the present embodiment is used in a high humidity state, for example, the sealing gel 8 contains moisture, and the moisture penetrates the surface protective layer 6 such as polyimide. Then, a leak path of the current on the surface of the interlayer dielectric film 12 occurs from the outer peripheral part of the semiconductor device 300 (a right side in FIG. 7) to the gate pad 16 (control electrode). When such a leak path occurs, under an assumption that a resistance of the leak path is constant, a potential [V] of the surface of the interlayer dielectric film 12 right above the position y when the rated voltage V [V] is applied to the rear surface electrode 7 is expressed as:

$$W_3(V-V_{goff})/(W_3+W_4)+V_{goff} \quad (6)$$

A potential of the position y at this time is the same as the rated voltage V [V]. Accordingly, a potential difference [V]

which occurs between the position y and the surface of the interlayer dielectric film 12 right above the position y is expressed as:

$$W_4(V-V_{goff})/(W_3+W_4) \quad (7)$$

Since the total film thickness of the field insulating film 3 and the interlayer dielectric film 12 is t' [μm], an average electrical field in the field insulating film 3 and the interlayer dielectric film 12 at the position y is expressed as:

$$W_4(V-V_{goff})/t'(W_3+W_4) \quad (8)$$

Since the field insulating film 3 and the interlayer dielectric film 12 mainly contain the silicon oxide or the silicon nitride, a dielectric breakdown electrical field of these insulating films is approximately 5 to 10 MV/cm. However, with a high voltage near 5 MV/cm, insulation characteristics of the field insulating film 3 and the interlayer dielectric film 12 may be reduced due to injection of an electron or positive hole accelerated by the electrical field, and an element breakdown may occur in the semiconductor device 300 in some cases. Moreover, there is an example of a report that also with approximately 3 MV/cm, the oxide film deteriorates in a few decades and is therefore broken.

Accordingly, in the semiconductor device 300 according to the present invention, the electrical field applied to the field insulating film 3 and the interlayer dielectric film 12 is set to 3 MV/cm or smaller. The following inequality needs to be satisfied to suppress the electrical field applied to the field insulating film 3 and the interlayer dielectric film 12 to 3 MV/cm or smaller.

$$t' \geq W_4(V-V_{goff})/300(W_3+W_4) \quad (9)$$

As described above, according to the semiconductor device according to embodiment 3 of the present invention, even when the sealing gel 8 and the surface protective film 6 contain moisture and the leak path therefore occurs on the surface of the interlayer dielectric film 12, the average electrical field applied to the field insulating film 3 and the interlayer dielectric film 12 can be suppressed to 3 MV/cm or smaller, thus the breakdown of the element in the semiconductor device can be suppressed, and the reliability of the semiconductor device can be enhanced.

Embodiment 4

Although embodiments 1 to 3 describe the examples of the case of having a single terminal well region 2 in the terminal part, the present invention may be applied to a case of having the terminal well region 2 and a plurality of separate well regions 2' which are separated from each other. Thus, the case of applying the present invention to the SiC-SBD having the plurality of separate well regions 2' is described as embodiment 4.

Figure 9:
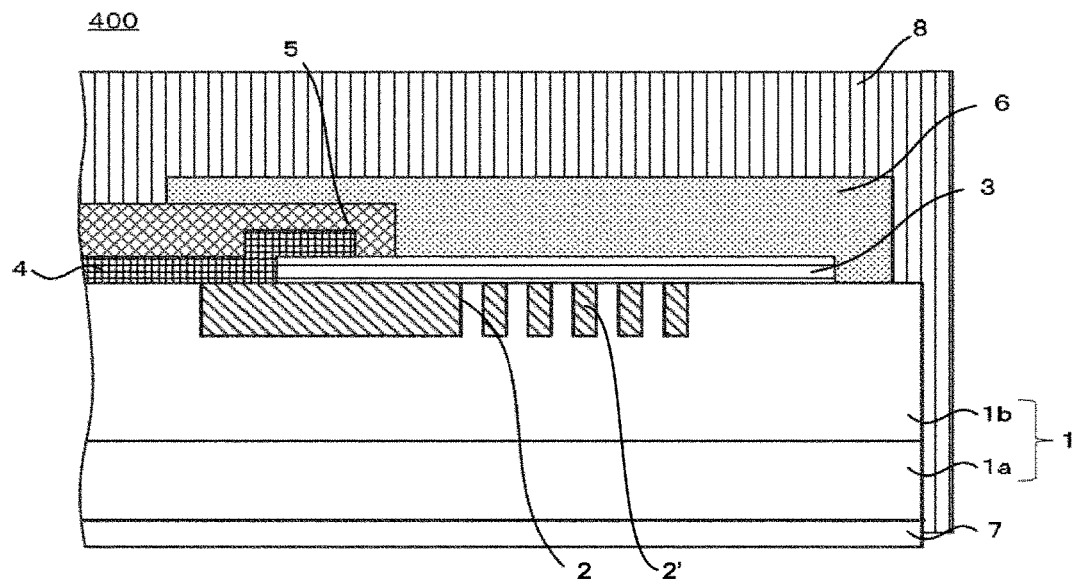
FIG. 9 A cross sectional view schematically illustrating the terminal part of the semiconductor device according to an embodiment 4 of the present invention.

FIG. 9 is a cross sectional view schematically illustrating a configuration of a terminal part of a semiconductor device 400 according to embodiment 4. As illustrated in FIG. 9, in addition to the terminal well region 2 to which the Schottky electrode 4 as the first surface electrode is connected, the separate well regions 2' separated from the terminal well region 2 and divided into several parts are formed outside the terminal well region 2 in the outer peripheral part of the surface-layer part of the semiconductor layer 1b in the terminal part of the semiconductor device 400. Another configuration is similar to that of embodiment 1, thus the detailed description is omitted.

In the SiC-SBD which is the semiconductor device 400 according to the present embodiment, when a negative voltage is applied to the rear surface electrode with respect to the surface electrode (the first surface electrode and the second surface electrode), a current flows from the surface electrode to the rear surface electrode 7, and the semiconductor device 400 enters a conduction state (on-state).

In contrast, when a positive voltage is applied to the rear surface electrode 7 with respect to the surface electrode (the first surface electrode and the second surface electrode) in the semiconductor device 400 according to the present embodiment, the semiconductor device 400 enters a blocking state (off-state).

Figure 10:
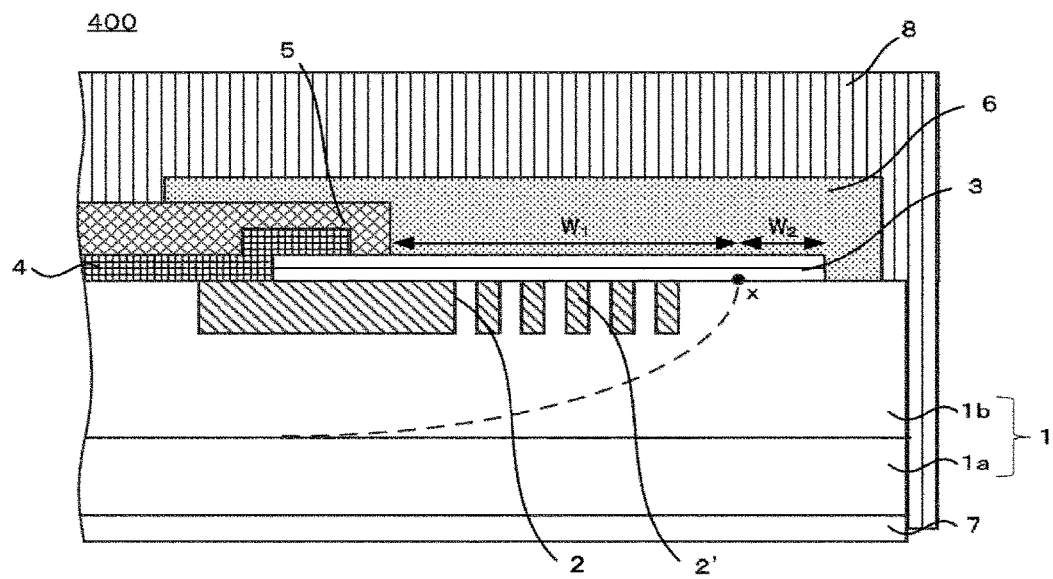
FIG. 10 A cross sectional view schematically illustrating a spread of the depletion layer in the off-state in the terminal part of the semiconductor device according to embodiment 4 of the present invention.

When the semiconductor device 400 enters the off-state, the depletion layer expands from the terminal well region 2 connected to the Schottky electrode 4 toward the outer peripheral direction of the semiconductor layer 1b and the direction of the semiconductor substrate 1a as illustrated in FIG. 10. Herein, a position indicated by a dotted line indicates a position of the end of the depletion layer.

In a case where a concentration of the plurality of separate well regions 2' is large and a distance between the separate well regions 2' which are separately formed is small, when the positive voltage which is the rated voltage is applied to the rear surface electrode 7 with respect to the surface electrode, the depletion layer extends to a position x of the surface of the semiconductor layer 1b on the surface of the semiconductor layer 1b toward the outer peripheral direction to include all of the separate well regions 2' formed separately from the terminal well region 2, which is connected to the Schottky electrode 4, as illustrated in FIG. 10. At this time, $W_1$ is defined as a distance between the position x and the outer peripheral edge of the electrode pad 5 in the outer peripheral direction, and $W_2$ is defined as a distance between the position x and the outer peripheral edge of the field insulating film 3 in the outer peripheral direction.

Figure 11:
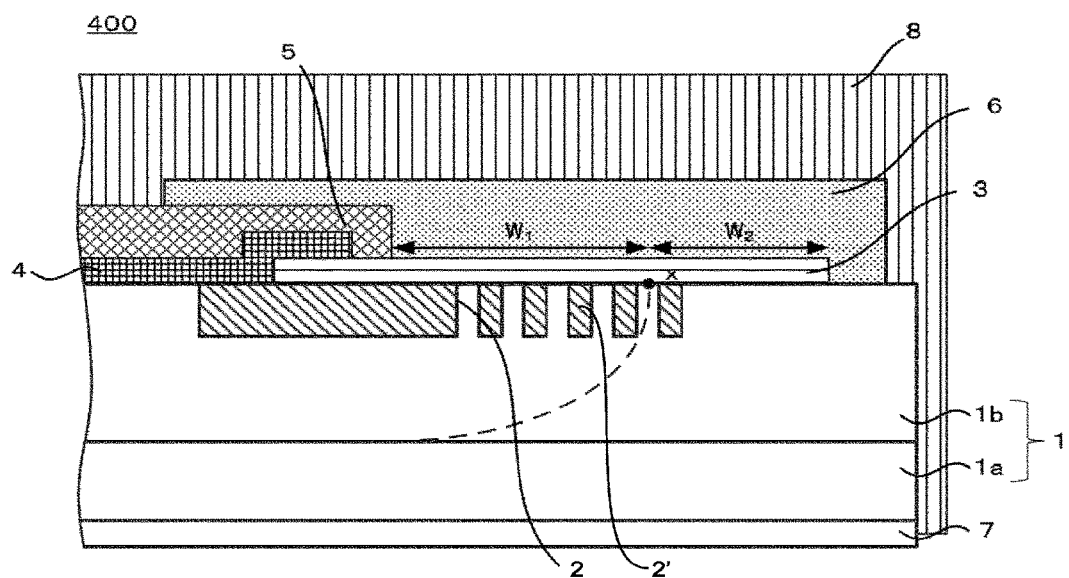
FIG. 11 A cross sectional view schematically illustrating a spread of the depletion layer in the off-state in the terminal part of the semiconductor device according to embodiment 4 of the present invention.

In a case where the concentration of the plurality of separate well regions 2' is small and the distance between the separate well regions 2' which are separately formed is large, when the positive voltage which is the rated voltage is applied to the rear surface electrode 7 with respect to the surface electrode, the depletion layer extends to a position x of the surface of the semiconductor layer 1b on the surface of the semiconductor layer 1b in the outer peripheral direction to include part of the separate well regions 2' formed separately from the terminal well region 2, which is connected to the Schottky electrode 4, as illustrated in FIG. 11.

In any case illustrated in FIG. 10 and FIG. 11, the thickness t [μm] of the field insulating film 3 is set to satisfy the inequality (1) as described in embodiment 1 with respect to a relationship with the position x extending from the terminal well region 2 connected to the Schottky electrode 4 in the manner similar to embodiment 1:

$$t \geq W_1 V/300(W_1+W_2) \quad (1)$$

In this manner, even when the sealing gel 8 and the surface protective film 6 contain moisture and the leak path therefore occurs on the surface of the field insulating film 3 in the SiC-SBD according to the present embodiment, the electrical field applied to the field insulating film 3 can be suppressed to 3 MV/cm or smaller, thus the breakdown of the element in the semiconductor device can be suppressed, and the reliability of the semiconductor device can be enhanced.

EXPLANATION OF REFERENCE SIGNS

1a semiconductor substrate, 1b semiconductor layer, 2 terminal well region, 3 field insulating film, 4 Schottky electrode (first surface electrode), 5 electrode pad (second surface electrode), 5a tapered part, 6 surface protective film, 7 rear surface electrode, 8 sealing gel, 9 active well region, 10 high concentration active well region, 11 source region, 12 interlayer dielectric film, 13 gate electrode, gate insulating film, 15 source electrode (third surface electrode), 16 gate pad (control electrode), 100, 200, 300, 400 semiconductor device

The invention claimed is:

1. A semiconductor device, comprising:
   a semiconductor substrate;
   a semiconductor layer of a first conductivity type being formed on said semiconductor substrate;
   a field insulating film being formed on a surface of said semiconductor layer;
   a surface electrode being formed on said surface of said semiconductor layer within an inner periphery of said field insulating film and extending onto said field insulating film;
   a well region of a second conductivity type being formed at a surface-layer part of said semiconductor layer in contact with said surface electrode and extending outward beyond an outer peripheral edge of said surface electrode;
   a surface protective film being made of an insulating material and formed on said surface electrode and said field insulating film to cover an outer peripheral edge of said surface electrode and an outer peripheral edge of said field insulating film;
   a sealing gel being formed, on said semiconductor layer and said surface protective film, on an outer peripheral part of said semiconductor layer; and
   a rear surface electrode formed on a rear surface of said semiconductor substrate, wherein
   x is defined as a position, at a surface between the semiconductor layer and the field insulating film, of an end of a depletion layer extending from said well region toward an outer peripheral direction of said semiconductor layer on said surface of said semiconductor layer when a rated voltage V [V] is applied to said rear surface electrode,
   $W_1$ is defined as a distance between said position x and said outer peripheral edge of said surface electrode in said outer peripheral direction,
   $W_2$ is defined as a distance between said position x and said outer peripheral edge of said field insulating film in said outer peripheral direction,
   t [μm] is defined as a film thickness of said field insulating film, and
   a layout of a terminal part is defined so that an electrical field in said field insulating film at said position x expressed as $W_2 V/t(W_1+W_2)$ is 3 MV/cm or smaller.

2. The semiconductor device according to claim 1, wherein
   said field insulating film mainly contains silicon oxide.

3. The semiconductor device according to claim 1, wherein
   said surface protective film is polyimide.

4. The semiconductor device according to claim 1, wherein
   said gel is a silicone gel.

5. The semiconductor device according to claim 1, wherein
   said surface electrode is Schottky-connected to said semiconductor layer.

6. The semiconductor device according to claim 1, wherein
   said well region at said surface-layer part of said semiconductor layer includes a terminal well region of a second conductivity type formed in a terminal part and an active well region of a second conductivity type provided in an active region to be separated from said terminal well region, and
   said surface electrode is ohmic-connected to said well region.

7. The semiconductor device according to claim 1, further comprising
   a plurality of separate well regions which are separated from each other and arranged outside said well region, in addition to said well region.

8. The semiconductor device according to claim 1, wherein
   said semiconductor substrate and said semiconductor layer are made of a wide band gap semiconductor material.

9. The semiconductor device according to claim 1, wherein
   each of said semiconductor substrate and said semiconductor layer is made of a silicon carbide semiconductor material.

* * * * *